US012643130B2

(12) United States Patent
Choi et al.

(10) Patent No.: US 12,643,130 B2
(45) Date of Patent: Jun. 2, 2026

(54) APPARATUS FOR MANUFACTURING SEMICONDUCTOR DEVICE AND METHOD OF MANUFACTURING SEMICONDUCTOR DEVICE USING THE SAME

(71) Applicant: Samsung Electronics Co., Ltd., Suwon-si (KR)

(72) Inventors: Dae-Woong Choi, Suwon-si (KR); Yong Myung Jun, Suwon-si (KR); Hyun-Chul Kim, Suwon-si (KR); Chang Seok Seo, Suwon-si (KR); Chan Jeon, Suwon-si (KR); Woo Seok Choe, Suwon-si (KR); In Sung Huh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 292 days.

(21) Appl. No.: 18/217,815

(22) Filed: Jul. 3, 2023

(65) Prior Publication Data

US 2024/0001408 A1 Jan. 4, 2024

(30) Foreign Application Priority Data

Jul. 4, 2022 (KR) ........................ 10-2022-0081854

(51) Int. Cl.
 *B08B 3/02* (2006.01)
 *B08B 3/08* (2006.01)
 (Continued)

(52) U.S. Cl.
 CPC .................. *B08B 3/02* (2013.01); *B08B 3/08* (2013.01); *B08B 5/02* (2013.01); *B08B 13/00* (2013.01); *H10P 72/7602* (2026.01); *F26B 5/005* (2013.01)

(58) Field of Classification Search
 CPC .... B08B 3/02; B08B 3/08; B08B 5/02; B08B 13/00; H01L 21/68707; H01L 21/67028;
 (Continued)

(56) References Cited

U.S. PATENT DOCUMENTS 7,284,917 B2    10/2007  Ishida et al.
2006/0177586 A1*  8/2006  Ishida ............... H01L 21/67184
                                          427/430.1
 (Continued)

FOREIGN PATENT DOCUMENTS

JP        6-85034  A      3/1994
JP        7-302827 A     11/1995
 (Continued)

OTHER PUBLICATIONS

Machine translation of KR-20160147164-A (Year: 2016).*
 (Continued)

*Primary Examiner* — Erin F Bergner
(74) *Attorney, Agent, or Firm* — Sughrue Mion, PLLC

(57) ABSTRACT

An apparatus for manufacturing a semiconductor device, including: a wet treatment chamber; a nozzle provided in the wet treatment chamber and configured to spray a treatment material onto a substrate; a supercritical fluid treatment chamber configured to supply a supercritical fluid onto the substrate to treat the substrate; a transfer device comprising an arm configured to transfer the substrate between the wet treatment chamber and the supercritical fluid treatment chamber; and a controller configured to control the wet treatment chamber to spray the treatment material onto the arm.

15 Claims, 10 Drawing Sheets

(51) Int. Cl.

| | |
|---|---|
| *B08B 5/02* | (2006.01) |
| *B08B 13/00* | (2006.01) |
| *H10P 72/76* | (2026.01) |
| *F26B 5/00* | (2006.01) |

(58) Field of Classification Search

CPC ......... H01L 21/67034; H01L 21/67051; H01L 21/6719; H01L 21/67253; H01L 21/67748; H01L 21/67742; F26B 5/005

See application file for complete search history.

(56) References Cited

U.S. PATENT DOCUMENTS

| | | | | |
|---|---|---|---|---|
| 2009/0028672 | A1* | 1/2009 | Yamawaku | ......... H10P 72/3402 414/217 |
| 2020/0365437 | A1* | 11/2020 | Kawahara | ............. B08B 7/0021 |

FOREIGN PATENT DOCUMENTS

| | | | | | |
|---|---|---|---|---|---|
| JP | 8-153680 | A | | 6/1996 | |
| JP | 2009-123801 | A | | 6/2009 | |
| JP | 2009-212335 | A | | 9/2009 | |
| KR | 10-2010-0046897 | A | | 5/2010 | |
| KR | 10-2011-0077045 | A | | 7/2011 | |
| KR | 10-2011-0080863 | A | | 7/2011 | |
| KR | 10-2016-0076366 | A | | 6/2016 | |
| KR | 20160147164 | A | * | 12/2016 | ....... H01L 21/02052 |
| KR | 20190041159 | A | * | 4/2019 | ....... H01L 21/67242 |
| KR | 10-2256132 | B1 | | 5/2021 | |
| KR | 10-2022-0067619 | A | | 5/2022 | |

OTHER PUBLICATIONS

Machine translation of KR-20190041159-A (Year: 2019).*

Communication issued Feb. 10, 2026 by the Korean Ministry of Intellectual Property in Korean Patent Application No. 10-2022-0081854.

* cited by examiner

1

APPARATUS FOR MANUFACTURING SEMICONDUCTOR DEVICE AND METHOD OF MANUFACTURING SEMICONDUCTOR DEVICE USING THE SAME

CROSS-REFERENCE TO RELATED APPLICATION

This application is based on and claims priority under 35 U.S.C. § 119 from Korean Patent Application No. 10-2022-0081854 filed on Jul. 4, 2022 in the Korean Intellectual Property Office, the disclosure of which is incorporated by reference herein in its entirety.

BACKGROUND

1. Field

The present disclosure relates to an apparatus for manufacturing a display device and a method of manufacturing a semiconductor device using the same.

2. Description of Related Art

In order to manufacture a semiconductor device, various processes such as deposition, photography, etching, and cleaning are performed. A cleaning process, in particular, may accompany spin-drying materials that remain on a substrate, by applying a centrifugal force to the substrate via a spin chuck.

As the line width of circuit patterns decreases, it has become increasingly difficult to apply a spin drying method that rotates a wafer at high speed, because there is a risk that microcircuit patterns may be damaged by the centrifugal force generated upon the rotation of the wafer at high speed. Accordingly, a method of drying a wafer by injecting a high-pressure supercritical fluid into a chamber where the wafer is disposed has been used.

As the cleaning and drying processes are continuously performed, there is an increasing need to efficiently manage contamination that may occur during each process step in order to improve the reliability and yield of a semiconductor device.

SUMMARY

Provided is an apparatus for manufacturing a semiconductor device for efficiently managing contamination that may occur during the fabrication of a semiconductor device.

Also provided is a method of manufacturing a semiconductor device for efficiently managing contamination that may occur during the fabrication of a semiconductor device.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

In accordance with an aspect of an example embodiment, an apparatus for manufacturing a semiconductor device includes: a wet treatment chamber; a nozzle provided in the wet treatment chamber and configured to spray a treatment material onto a substrate; a supercritical fluid treatment chamber configured to supply a supercritical fluid onto the substrate to treat the substrate; a transfer device comprising an arm configured to transfer the substrate between the wet treatment chamber and the supercritical fluid treatment chamber; and a controller configured to control the wet treatment chamber to spray the treatment material onto the arm.

In accordance with an aspect of an example embodiment, an apparatus for manufacturing a semiconductor device includes: a wet treatment chamber; a support provided in the wet treatment chamber and configured to support a substrate; a first nozzle provided in the wet treatment chamber and configured to spray a first rinsing material onto the substrate; a second nozzle provided in the wet treatment chamber and configured to spray a second rinsing material onto the substrate; a supercritical fluid treatment chamber configured to supply a supercritical fluid onto the substrate to treat the substrate; a transfer device comprising an arm configured to transfer the substrate between the wet treatment chamber and the supercritical fluid treatment chamber; and a controller configured to control the first nozzle to spray the first rinsing material and the second nozzle to spray the second rinsing material onto the arm and the support.

In accordance with an aspect of an example embodiment, a method of manufacturing a semiconductor device using an apparatus for manufacturing the semiconductor device includes: placing an arm of a transfer device included in the apparatus into a wet treatment chamber included in the apparatus, wherein the arm is configured to transfer a substrate between the wet treatment chamber and a supercritical fluid treatment chamber included in the device, and wherein the wet treatment chamber includes a support configured to support the substrate, a first nozzle, and a second nozzle; spraying a first treatment material onto the arm using the first nozzle; and spraying a second treatment material onto the arm using the second nozzle.

It should be noted that the effects of the present disclosure are not limited to those described above, and other effects of the present disclosure will be apparent from the following description.

BRIEF DESCRIPTION OF THE DRAWINGS

The above and other aspects, features, and advantages of the present disclosure will be more apparent from the following description taken in conjunction with the accompanying drawings, in which.

DETAILED DESCRIPTION

Hereinafter, example embodiments of the present disclosure will be described with reference to the accompanying drawings.

As is traditional in the field, embodiments may be described and illustrated in terms of blocks which carry out a described function or functions. These blocks, as shown in the drawings, which may be referred to herein as units or modules or the like, may be physically implemented by analog or digital circuits such as logic gates, integrated circuits, microprocessors, microcontrollers, memory circuits, passive electronic components, active electronic components, optical components, hardwired circuits, or the like, and may be driven by firmware and software. The circuits may, for example, be embodied in one or more semiconductor chips, or on substrate supports such as printed circuit boards and the like. Circuits included in a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks. Likewise, the blocks of the embodiments may be physically combined into more complex blocks.

Figure 1:
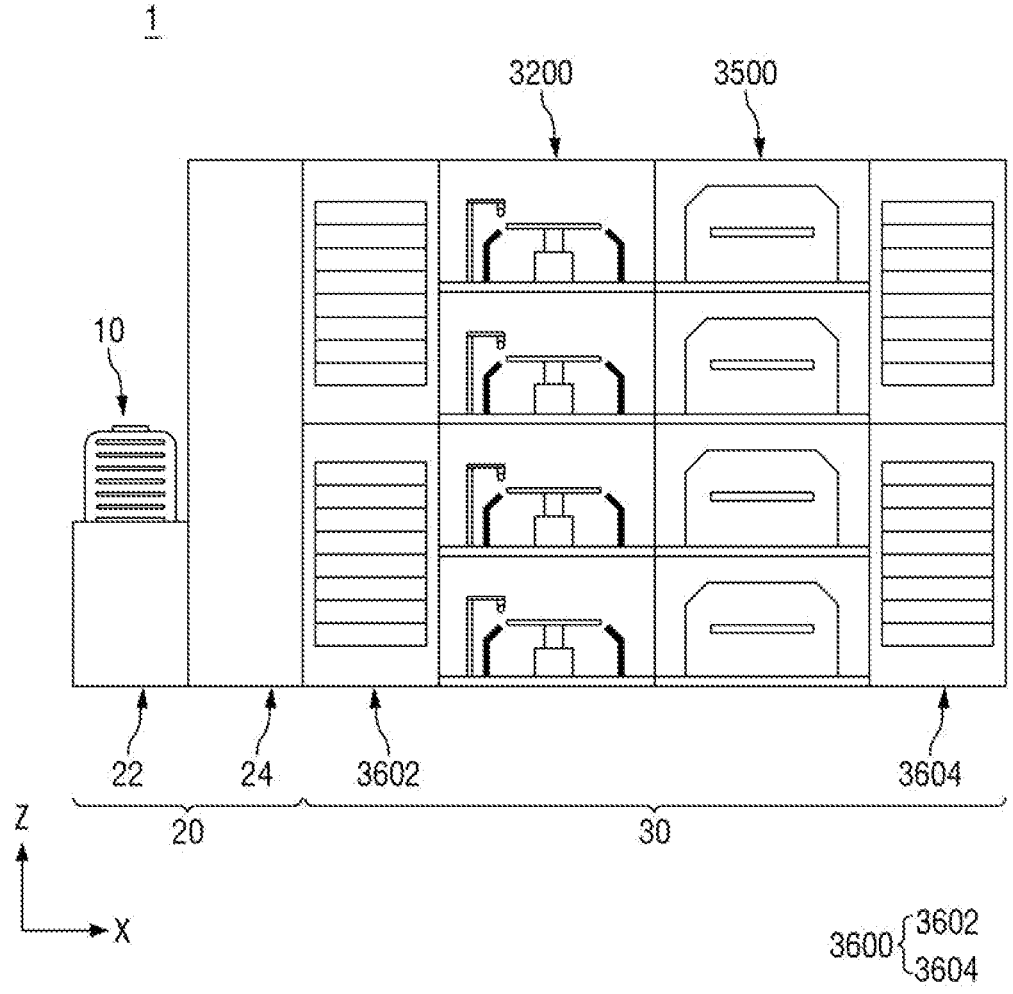
FIG. 1 is a cross-sectional view of an apparatus for manufacturing a semiconductor device, according to an embodiment.
Figure 2:
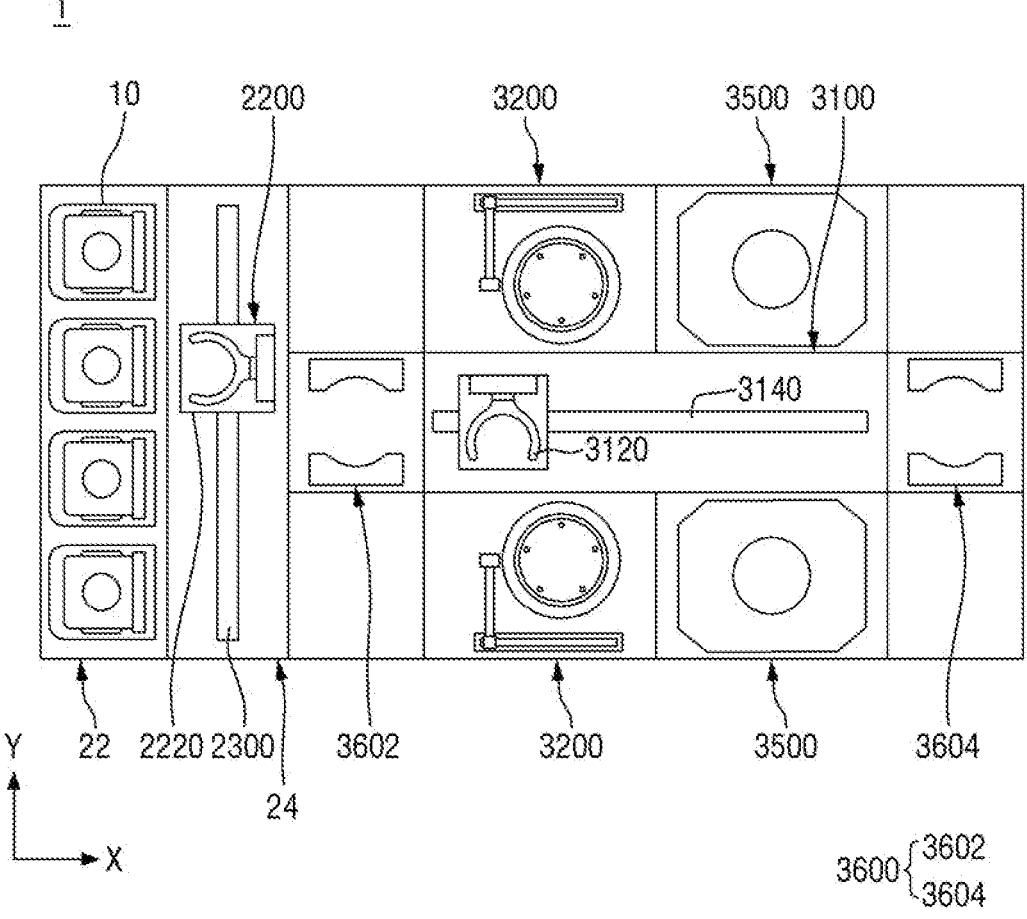
FIG. 2 is a plan view of the apparatus of FIG. 1, according to an embodiment.
Figure 3:
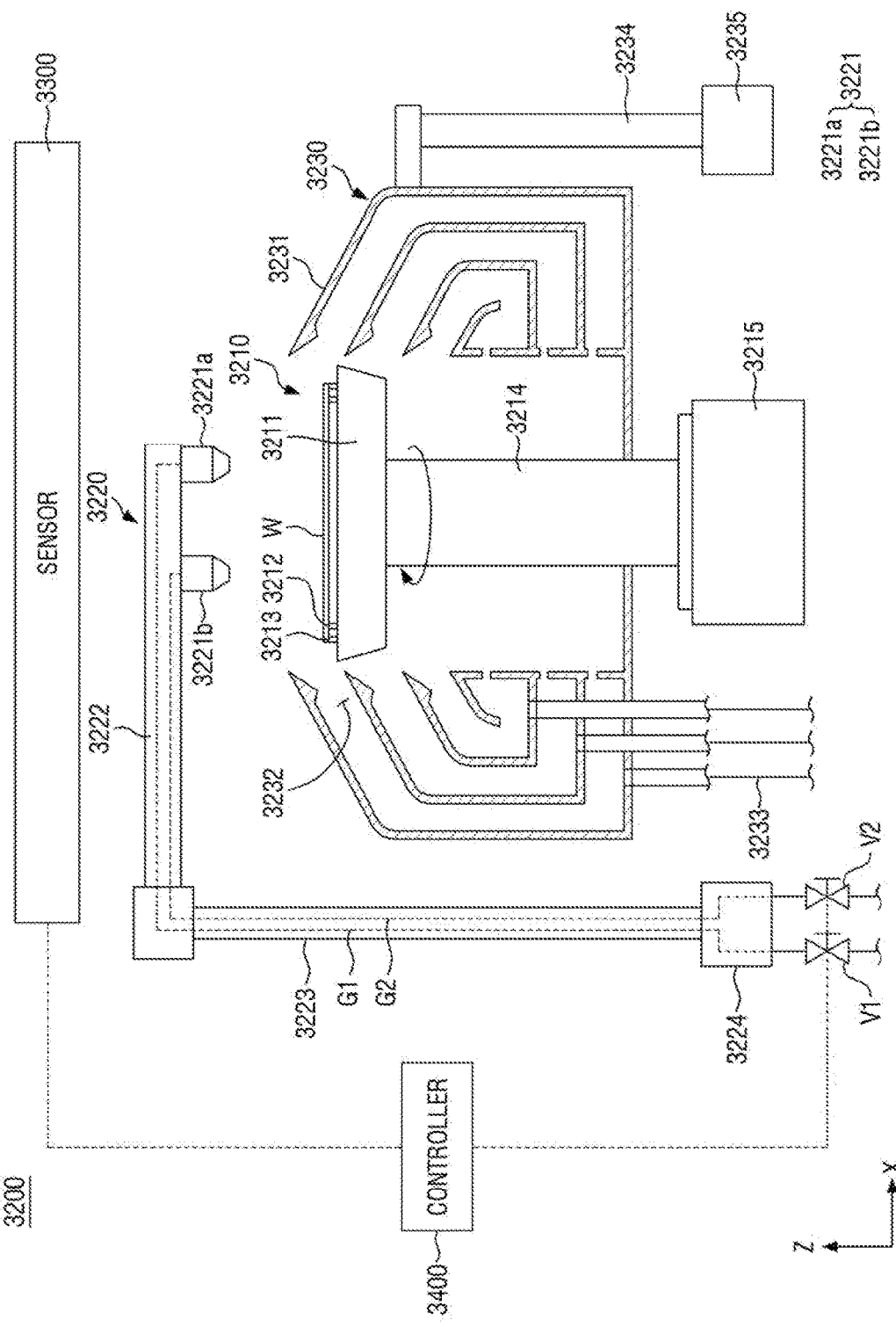
FIG. 3 illustrates a wet treatment chamber of the apparatus of FIG. 1, according to an embodiment.
Figure 4:
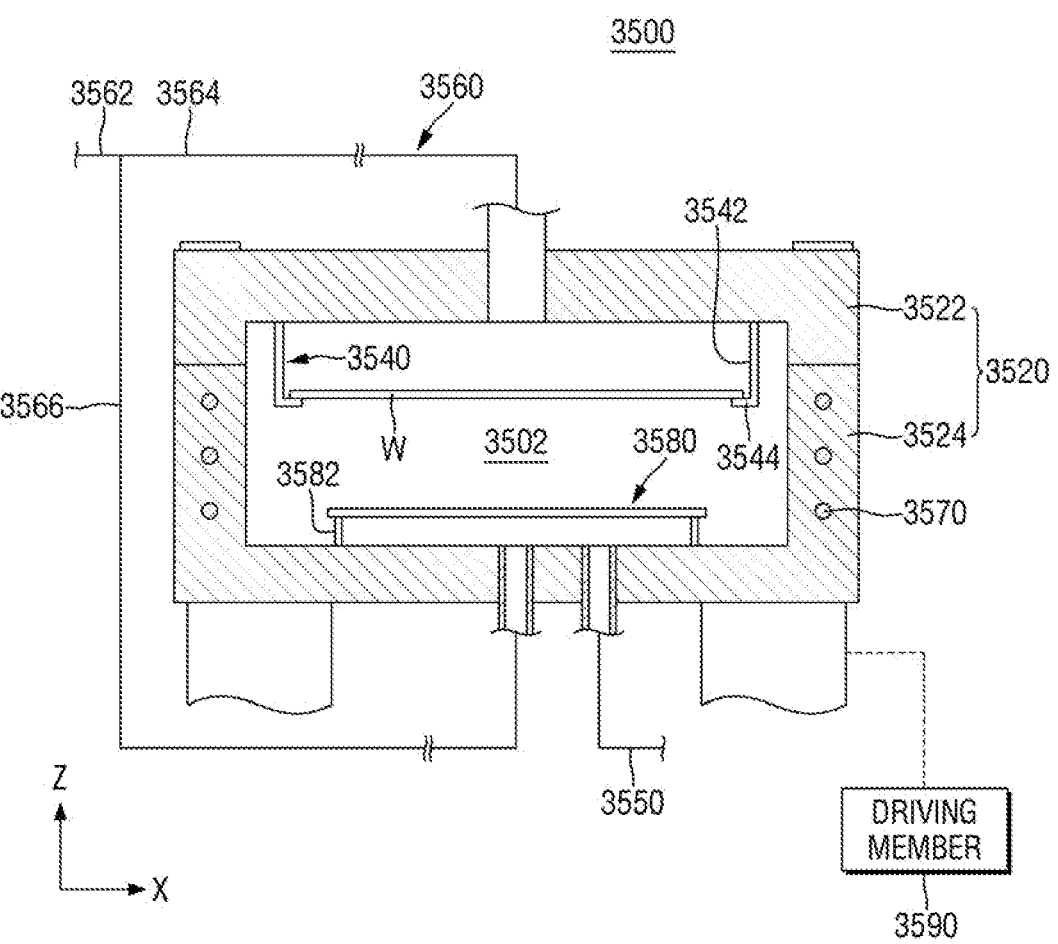
FIG. 4 illustrates a supercritical fluid treatment chamber of the apparatus of FIG. 1, according to an embodiment.

FIG. 1 is a cross-sectional view of an apparatus for manufacturing a semiconductor device according to some embodiments of the present disclosure. FIG. 2 is a plan view of the apparatus of FIG. 1. FIG. 3 illustrates a wet treatment chamber of the apparatus of FIG. 1. FIG. 4 illustrates a supercritical fluid treatment chamber of the apparatus of FIG. 1

Referring to FIGS. 1 through 4, an apparatus 1 for manufacturing a semiconductor device may include an index module 20 and a treatment module 30. In some embodiments, the index module 20 and the treatment module 30 may be sequentially arranged, for example arranged sequentially in a row. The direction in which the index module 20 and the treatment module 30 are arranged may be referred to as a first direction X, a direction intersecting the first direction X, as viewed from above, may be referred to as a second direction Y, and a direction intersecting both the first and second directions X and Y may be referred to as a third direction Z.

The index module 20 may transfer substrates W, which may be for example silicon wafers, from containers 10 where the substrates W are accommodated, to the treatment module 30, and may accommodate the substrates W that have been treated, for example substrates W for which a treatment is finished, back in the containers 10. The index module 20 may extend in the second direction Y. The index module 20 may include a load port 22 and an index frame 24. The load port 22 and the treatment module 30 may be disposed on opposite sides of the index frame 24. The containers 10 may be placed in the load port 22. A plurality of load ports 22 may be provided and arranged along the second direction Y.

Closed containers such as front open unified pods (FOUPs) may be used as the containers 10. Although not specifically illustrated, the containers 10 may be placed in the load port 22 by transfer means such as an overhead transfer, an overhead conveyor, or an automatic guided vehicle or by an operator.

An index robot 2200 may be provided in the index frame 24. In embodiments, the index robot 2200 may be, for example a robotic device such as a robotic arm or a robotic manipulator. A guide rail 2300 may be provided in the index frame 240 such that the longitudinal direction of the guide rail 2300 may coincide with the second direction Y, and the index robot 2200 may be provided to be movable on the guide rail 2300. The index robot 2200 may include manipulators such as hands, on which each of the substrates W can be placed, and the hands may be provided to be able to move forward and backward, rotate about the third direction Z, and move along the third direction Z.

In some embodiments, the treatment module 30 may perform treatment on the substrates W. For example, the treatment module 30 may perform wet treatment and supercritical fluid treatment on the substrates W.

The treatment module 30 may include treatment blocks for performing treatment on the substrates W. A plurality of treatment blocks may be provided and may be stacked on one another. Each of the treatment blocks may include a transfer chamber 3100, wet treatment chambers 3200, supercritical fluid treatment chambers 3500, and buffer chambers 3600.

The transfer chamber 3100 may transfer the substrates W between the wet treatment chambers 3200 and the supercritical fluid treatment chambers 3500, in the treatment module 30. The transfer chamber 3100 may extend in the first direction X. A transfer device 3120 may be provided in the transfer chamber 3100. The transfer device 3120 may transfer the substrates W between the wet treatment chambers 3200 and the supercritical fluid treatment chambers 3500.

For example, the transfer device 3120 may include manipulators such as arms A, on which each of the substrates W can be placed, and the arms A may be provided to be able to move forward and backward, rotate about the third direction Z, and move along the third direction Z. A guide rail 3140, which extends in parallel to the first direction X, may be provided in the transfer chamber 3100, and the transfer device 3120 may be provided to be movable on the guide rail 3140.

Figure 7:
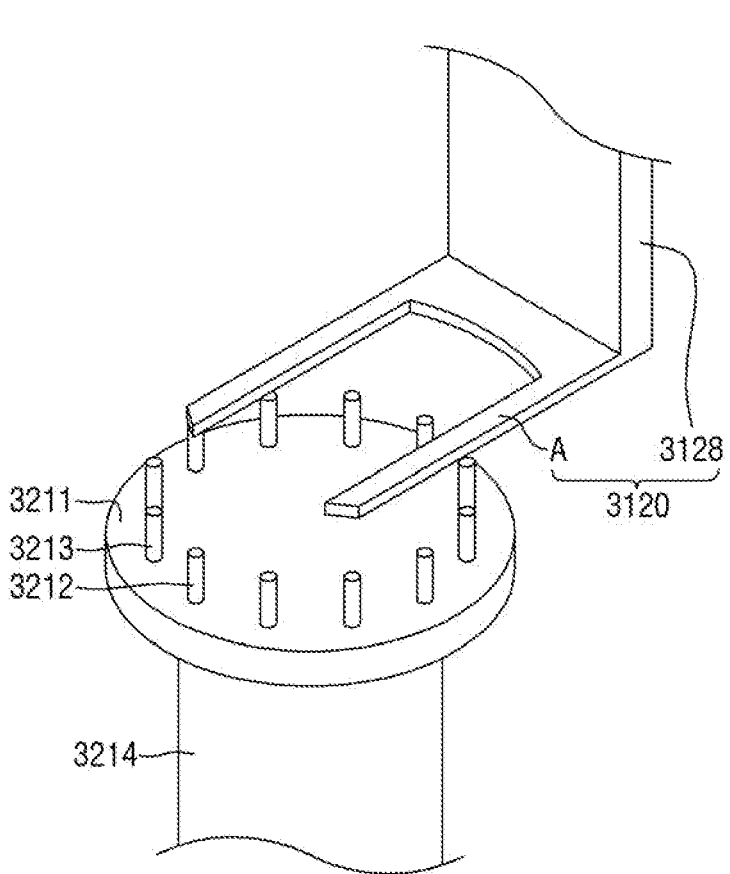

Referring to FIG. 7, the transfer device 3120 may include a base 3128 and the arms A. The arms A may have an arc-like shape. The arms A may extend from the base 3128. A plurality of arms A may be provided to support the edges of each of the substrates W.

The wet treatment chambers 3200 may be used to perform a rinsing process for removing foreign materials from the substrates W. However, the wet treatment chambers 3200 may be used not only for a particular rinsing process, and may also be used in a substrate treatment process using various chemicals. For example, the wet treatment chambers 320 may perform both an etching process for etching films on each of the substrates W and a rinsing process following the etching process and may also perform both a stripping process for removing films or foreign materials on each of the substrates W and a rinsing process following the stripping process.

The wet treatment chambers 3200 may be disposed on sides of the transfer chambers 3100. A plurality of wet treatment chambers 3200 may be provided. The wet treatment chambers 3200 may be stacked on one another. The plurality of wet treatment chambers 3200 may be disposed on the opposite sides of the transfer chamber 3100. The plurality of wet treatment chambers 3200 may be disposed between the index module 20 and the supercritical fluid treatment chambers 3500. As many wet treatment chambers 3200 as there are supercritical fluid treatment chambers 3500 may be provided, but embodiments are not limited thereto. For example, the number of wet treatment chambers 3200 may vary depending on the footprint and the efficiency of the apparatus 1.

Referring to FIG. 3, a wet treatment chamber 3200 may treat a substrate W by applying a treatment material on the substrate W. The wet treatment chamber 3200 may include a housing, a support unit or support 3210, a treatment material supply member 3220, and a retrieval member 3230.

The housing of the wet treatment chamber 3200 may provide space in which to treat the substrate W.

The support unit or support 3210 may support the substrate W. The support unit or support 3210 may rotate the substrate W. The support unit or support 3210 may include a support plate 3211, support pins 3212, chuck pins 3213, a rotation shaft 3214, and a rotary actuator 3215. The substrate W may be mounted on the support plate 3211, and the top surface of the support plate 3211 may have the same shape as, or a similar shape to, the top surface of the substrate W.

The support pins 3212 and the chuck pins 3213 may be provided on the top surface of the support plate 3211. The support pins 3212 may support the bottom surface of the substrate W. The support pins 3212 may protrude upwardly from the top surface of the support plate 3211. The chuck pins 3213 may fix the substrate W. In embodiments, the diameter of the chuck pins 3213 may be greater than the diameter of the support pins 3212.

The chuck pins 3213 may support the side of the substrate W and may thus prevent the substrate W from being separated laterally by a rotational force during the rotation of the substrate W. The rotation shaft 3214 may be connected to the bottom of the support plate 3212. The rotation shaft 3214 may receive a rotational force from the rotary actuator 3215 and may thus rotate the support plate 3211. As a result, the substrate W mounted on the support plate 3211 can be rotated. The chuck pins 3213 can prevent the substrate W from deviating or being displaced from its regular position.

The treatment material supply member 3220 may spray a treatment material to or onto the substrate W. The treatment material may include isopropyl alcohol (IPA) or $N_2$. The treatment material supply member 3220 may include nozzles 3221, a nozzle bar 3222, a nozzle shaft 3223, and a nozzle shaft driver 3224. The nozzles 3221 may supply the treatment material to the substrate W mounted on the support plate 3211. The nozzles 3221 may be formed at the bottom of one end of the nozzle bar 3222. The nozzle bar 3222 may be coupled to the nozzle shaft 3223. The nozzle shaft 3223 may be provided to be able to be elevated or rotated. The nozzle shaft driver 3224 may control the locations of the nozzles 3221 by elevating or rotating the nozzle shaft 3223.

The nozzles 3221 may include first and second nozzles 3221a and 3221b, which spray different treatment materials. The first and second nozzles 3221a and 3221b may be connected to a first material supply line G1, which may supply a first treatment material, and a second treatment material supply line G2, which may supply a second treatment material. In embodiments, the first treatment material supply line G1 may be connected to a first treatment material source which may provide the first treatment material, and the second treatment material supply line G2 may be connected to a second treatment material source, which may provide the second treatment material. A first valve V1 may be connected to the first treatment material supply line G1 and control the supply of the first treatment material, and a second valve V2 may be connected to the second treatment material supply line G2 and control the supply of the second treatment material.

The retrieval member 3230 may include retrieval containers 3231, retrieval lines 3233, an elevation bar 3234, and an elevation driver 3235. The retrieval containers 3231 may be provided as having a ring shape surrounding the support plate 3211. A plurality of retrieval containers 3231 may be provided. The retrieval containers 3231 may be provided as rings that are sequentially spaced apart from the support plate 3211, as viewed from above. The more apart the retrieval containers 3231 are from the support plate 3211, the higher the retrieval containers 3231 are positioned. Retrieval ports 3232, into which the treatment material scattered from the substrate W may be introduced, may be formed in the spaces between the retrieval containers 3231. The retrieval lines 3233 may be formed at the bottoms of the retrieval containers 3231. The elevation bar 3234 may be connected to the retrieval containers 3231.

The elevation bar 3234 may lift up or down the retrieval containers 3231 with power from the elevation driver 3235. In a case where there are multiple retrieval containers 3231, the elevation bar 3234 may be connected to the outermost retrieval container 3231. The elevation driver 3235 may elevate the retrieval containers 3231 via the elevation bar 3234 to control retrieval ports 3232 into which the scattered treatment material is introduced.

The wet treatment chamber 3200 may perform a rinsing process on the substrate W. A treatment material ejected from the wet treatment chamber 3200 may be a rinsing material or a drying material. Here, the treatment material may include IPA, deionized water (DIW), HF, $NH_4OH$, $H_2O_2$, or $N_2$. In this case, the nozzles 3221 of the wet treatment chamber 3200 may include supply members for spraying the treatment material. In this case, the wet treatment chamber 3200 may rinse a patterned surface of the substrate W.

In embodiments, the wet treatment chamber 3200 may further include a rinsing solution supply member, which may supply a rinsing solution for rinsing a non-patterned surface of the substrate W.

Referring to FIG. 4, a supercritical fluid treatment chamber 3500 may treat the substrate W by supplying a supercritical fluid to the substrate W. For example, the supercritical fluid treatment chamber 3500 may dry the substrate W by supplying the supercritical fluid to the substrate W. The supercritical fluid treatment chamber 3500 may perform a drying process on the substrate W treated by the wet treatment chamber 3200. In this case, any developing agent or organic solvent that may remain on the substrate W may be dried by the supercritical fluid treatment chamber 3500.

Referring to FIGS. 1 and 2, the supercritical fluid treatment chambers 3500 may be disposed on both sides of the transfer chamber 3100. A plurality of supercritical fluid treatment chambers 3500 may be provided. The plurality of supercritical fluid treatment chambers 3500 may be vertically stacked on one another. The supercritical fluid treatment chambers 3500 may be disposed on the outside of the wet treatment chambers 3200. The supercritical fluid treatment chambers 3500 may be disposed to face each other with respect to the transfer chamber 3100, as viewed from above, but embodiments are not limited thereto. For example, the layout of the supercritical fluid treatment chambers 3500 may vary depending on the footprint and the efficiency of the apparatus 1.

Referring again to FIG. 4, the supercritical fluid treatment chamber 3500 may remove a treatment material on the substrate W by using a supercritical fluid. The supercritical fluid treatment chamber 3500 may include a body 3520, a support 3540, a fluid supply unit 3560, and a blocking plate 3580. The body 3520 may provide an inner space 3502 in which to perform a drying process.

The body 3520 may include upper and lower bodies 3522 and 3524, and the upper and lower bodies 3522 and 3524 may be coupled together to provide the inner space 3502. The upper body 3522 may be provided on the lower body 3524. The upper body 3522 may be fixed, and the lower body 3524 may be lifted up or down by a driving member

3590 such as a cylinder. When the lower body 3524 is spaced apart from the upper body 3522, the inner space 3502 may be opened, and the substrate W may be loaded into, or unloaded from, the inner space 3502. During the operation of the supercritical fluid treatment chamber 3500, the upper body 3522 may be attached firmly to the lower body 3524 such that the inner space 3502 may be sealed from the outside.

The supercritical fluid treatment chamber 3500 may further include a heater 3570. For example, the heater 3570 may be disposed on an inner sidewall of the body 3520. The heater 3570 may heat the inner space 3502 of the body 3520 such that a fluid supplied into the inner space 3502 can maintain its supercritical state.

The support 3540 may support the substrate W, in the inner space 3502 of the body 3520. The support 3540 may include fixing rods 3542 and holders 3544. The fixing rods 3542 may be fixedly installed at the upper body 3522 to protrude downwardly from the bottom surface of the upper body 3522. The fixing rods 3542 may extend in the third direction Z. A plurality of fixing rods 3542 may be provided and may be spaced apart from one another. The fixing rods 3542 may be disposed such that the substrate W does not interfere with the fixing rods 3542 when the substrate W is being loaded in, or unloaded from, the space surrounded by the fixing rods 3542.

The holders 3544 may be coupled to the fixing rods 3542. The holders 3544 may extend from the ends of the fixing rods 3542 into the space surrounded by the fixing rods 3542. Accordingly, the edge of the substrate W loaded into the inner space 3502 of the body 3520 may be held by the holders 3544, and the entire top surface of the substrate W, the middle of the bottom surface of the substrate W, and part of the edge of the bottom surface of the substrate W may be exposed to a drying fluid supplied into the inner space 3502.

The fluid supply unit 3560 may supply the drying fluid into the inner space 3502 of the body 3520. For example, the drying fluid may be supplied into the inner space 3502 in a supercritical state. In embodiments, the drying fluid may be supplied into the inner space 3502 in a gaseous state, and may then be phase-changed to a supercritical state, in the inner space 3502.

The fluid supply unit 3560 may include a main supply line 3562, an upper branch line 3564, and a lower branch line 3566. The upper and lower branch lines 3564 and 3566 may branch off of the main supply line 3562. The upper branch line 3564 may be coupled to the upper body 3522 and may supply the drying fluid onto the substrate W on the support 3540. For example, the upper branch line 3564 may be coupled to the middle of the upper body 3522. The lower branch line 3566 may be coupled to the lower body 3524 and may supply the drying fluid from below the substrate W on the support 3540. For example, the lower branch line 3566 may be coupled to the middle of the lower body 3524.

An exhaust line 3550 may be connected to the lower body 3524. A supercritical fluid in the inner space 3502 of the body 3520 may be exhausted to the outside of the body 3520 through the exhaust line 3550.

The blocking plate 3580 may be disposed in the inner space 3502 of the body 3520. The blocking plate 3580 may have a disc shape. The blocking plate 3580 may be supported by supports 3582 to be vertically spaced apart from the bottom surface of the body 3520. The supports 3582 may have a rod shape. A plurality of supports 3582 may be formed to be a predetermined distance apart from one another. As viewed from above, the blocking plate 3580 may be provided to overlap with the outlet of the lower branch line 3566 and the inlet of the exhaust line 3550. The blocking plate 3580 may prevent the drying fluid supplied through the lower branch line 3566 from being discharged directly toward the substrate W and thereby damaging the substrate W.

Referring again to FIGS. 1 and 2, a plurality of buffer chambers 3600 may be provided. Some of the buffer chambers 3600 may be disposed between the index module 20 and the transfer chamber 3100 and will hereinafter be referred to as front buffers 3602. A plurality of front buffers 3602 may be provided and may be disposed to be vertically stacked on one another. Other buffer chambers 3600 may be disposed on the outside of the transfer chamber 3100 in the second direction Y and will hereinafter be referred to as rear buffers 3604. A plurality of rear buffers 3604 may be provided and may be disposed to be vertically stacked on one another. The front buffers 3602 and the rear buffers 3604 may temporarily store a plurality of substrates W therein. The substrates W stored in the front buffers 3602 may be loaded or unloaded by the index robot 2200 and the transfer device 3120. The substrates W stored in the rear buffer 3804 may be loaded or unloaded by the transfer device 3120.

A control unit or controller 3400 may control the first and second nozzles 3221*a* and 3221*b* of each of the wet treatment chambers 3200 and the transfer device 3120. The control unit or controller 3400 may be implemented by a processor (e.g., one or more programmed microprocessors and associated circuitry) and may control the first and second nozzles 3221*a* and 3221*b* of each of the wet treatment chambers 3200 such that a treatment material may be sprayed from the wet treatment chambers 3200 onto the arm A of the transfer device 3120 and the supporting plate 3211 of the support unit or support 3210 of each of the wet treatment chambers 3200. The control unit or controller 3400 may control the transfer device 3120 such that the arm A of the transfer device 3120 that has finished being rinsed may be loaded into the wet treatment chambers 3200 and then into the supercritical fluid treatment chambers 3500.

By using the apparatus 1 including the control unit or controller 3400, any contaminants may be effectively removed from the transfer device 3120 and the support units or supports 3210 that are in contact with the substrates W in the wet treatment chambers 3200. Also, the contamination of the arm A loaded into each of the supercritical fluid treatment chambers 3500 can be minimized. That is, any contamination that may occur in, and be caused by, each of a series of processes of manufacturing a semiconductor device can be managed through an automated system.

FIGS. 5 through 9 are perspective views illustrating operations of the apparatus of FIG. 1. FIG. 10 is a flowchart illustrating a method of manufacturing a semiconductor device using the apparatus of FIG. 1. For convenience, descriptions of elements or features that have already been described above with reference to FIGS. 1 through 4 may be omitted below.

Figure 5:
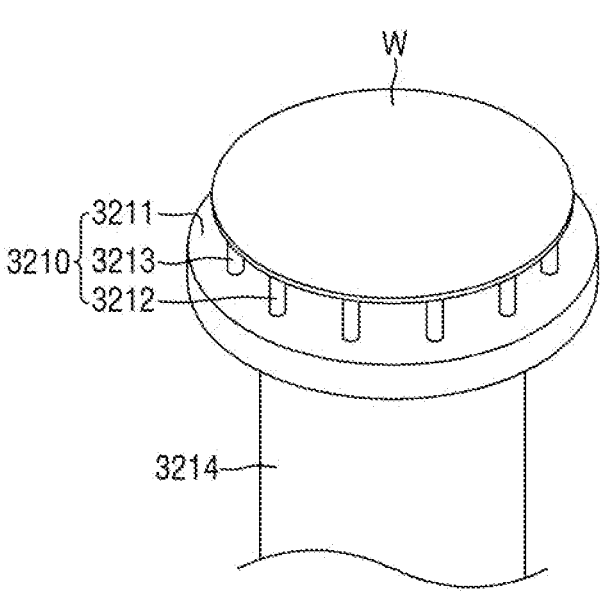
FIGS. 5 through 9 are perspective views illustrating operations of the apparatus of FIG. 1, according to an embodiment.

Referring to FIGS. 5 and 10, a substrate W (referred to hereinafter as the current substrate W) may be put in a wet treatment chamber 3200 to be placed on a support plate 3211 of the wet treatment chamber 3200. The control unit or controller 3400 may count the number of substrates W that have been put in the wet treatment chamber 3200 at operation S100.

Figure 6:
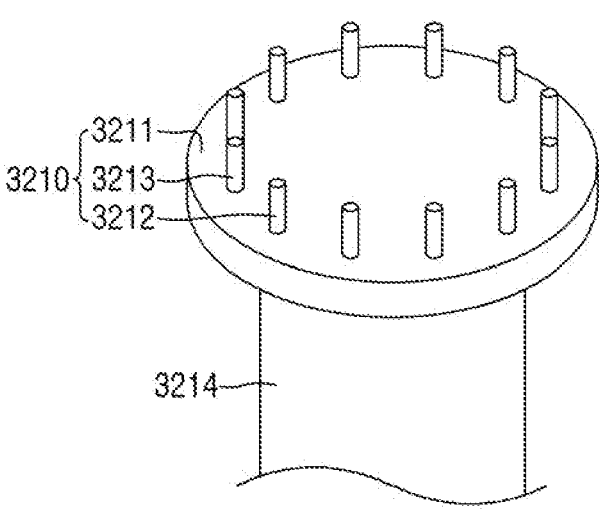

Thereafter, referring to FIGS. 6 and 10, if the number of substrates W that have been put in the wet treatment chamber 3200 reaches a predetermined value, the control unit or controller 3400 may control the current substrate W not to be put in the wet treatment chamber 3200 at operation S200. As a result, the current substrate W may not be placed on the support plate 3211.

Thereafter, referring to FIGS. 7 and 10, the control unit or controller 3400 may control a transfer device 3120 to be put in the wet treatment chamber 3200 at operation S300 with the current substrate W prevented from being put in the wet treatment chamber 3200. As a result, an arm A of the transfer device 3120 may be put in the wet treatment chamber 3200.

Figure 8:
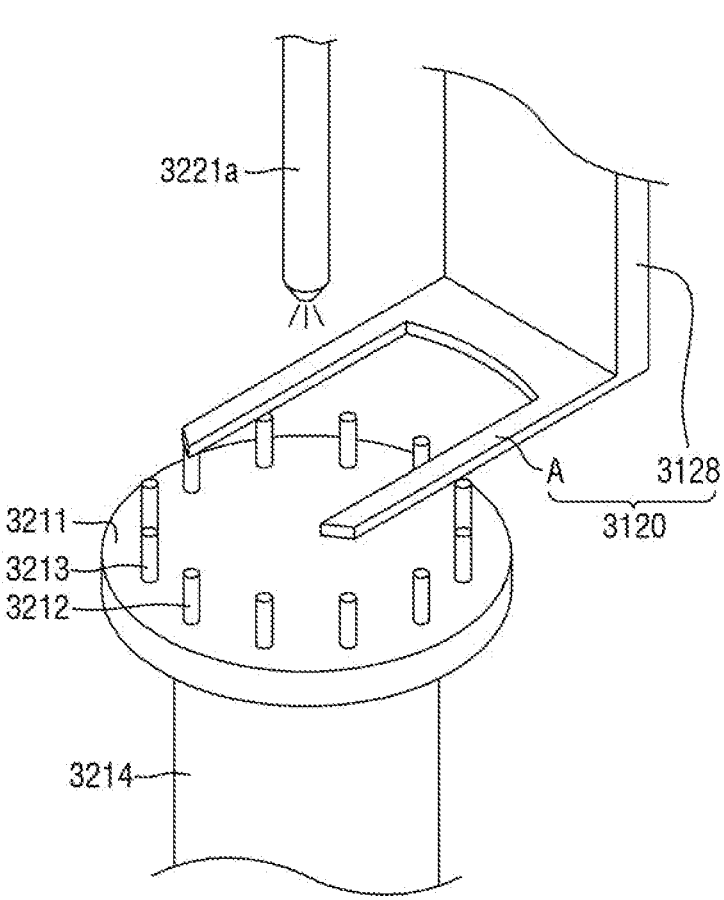

Thereafter, referring to FIGS. 8 and 10, the control unit or controller 3400 may control a first nozzle 3221a to spray a first treatment material onto the arm A at operation S400 with the current substrate W prevented from being put in the wet treatment chamber 3200.

Because the support plate 3211 is disposed below the arm A of the transfer device 3120, the first treatment material may also be sprayed onto the support plate 3211 by the control unit or controller 3400.

For example, the first treatment material may include IPA. In another example, the first treatment material may include a material for rinsing and/or drying the arm A and the support plate 3211, such as DIW, HF, $NH_4OH$, or $H_2O_2$. However, embodiments are not limited to these examples.

Figure 9:
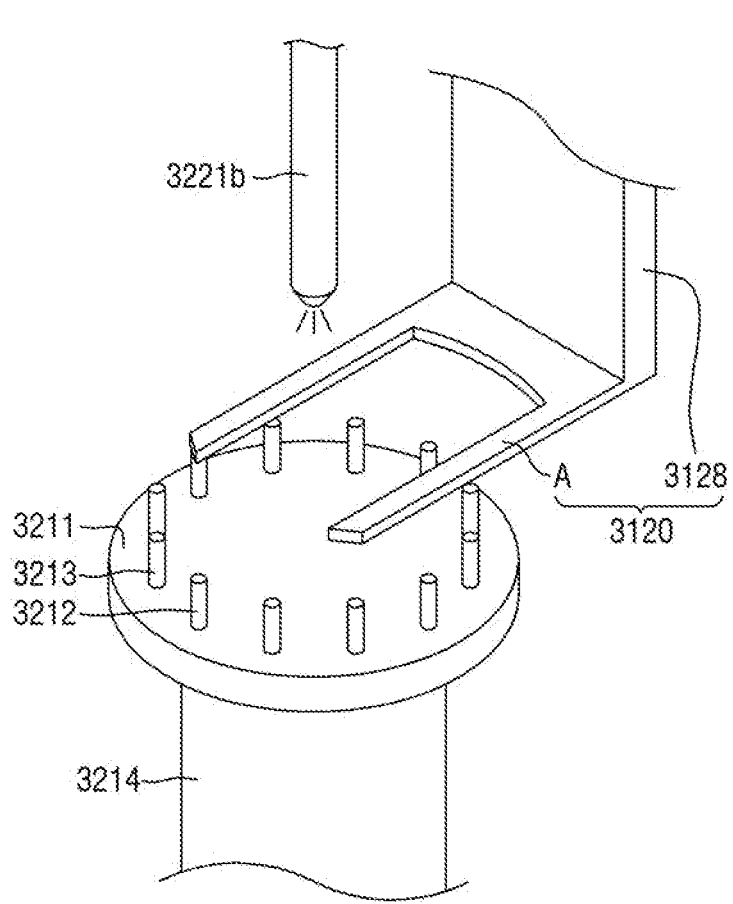
Figure 10:
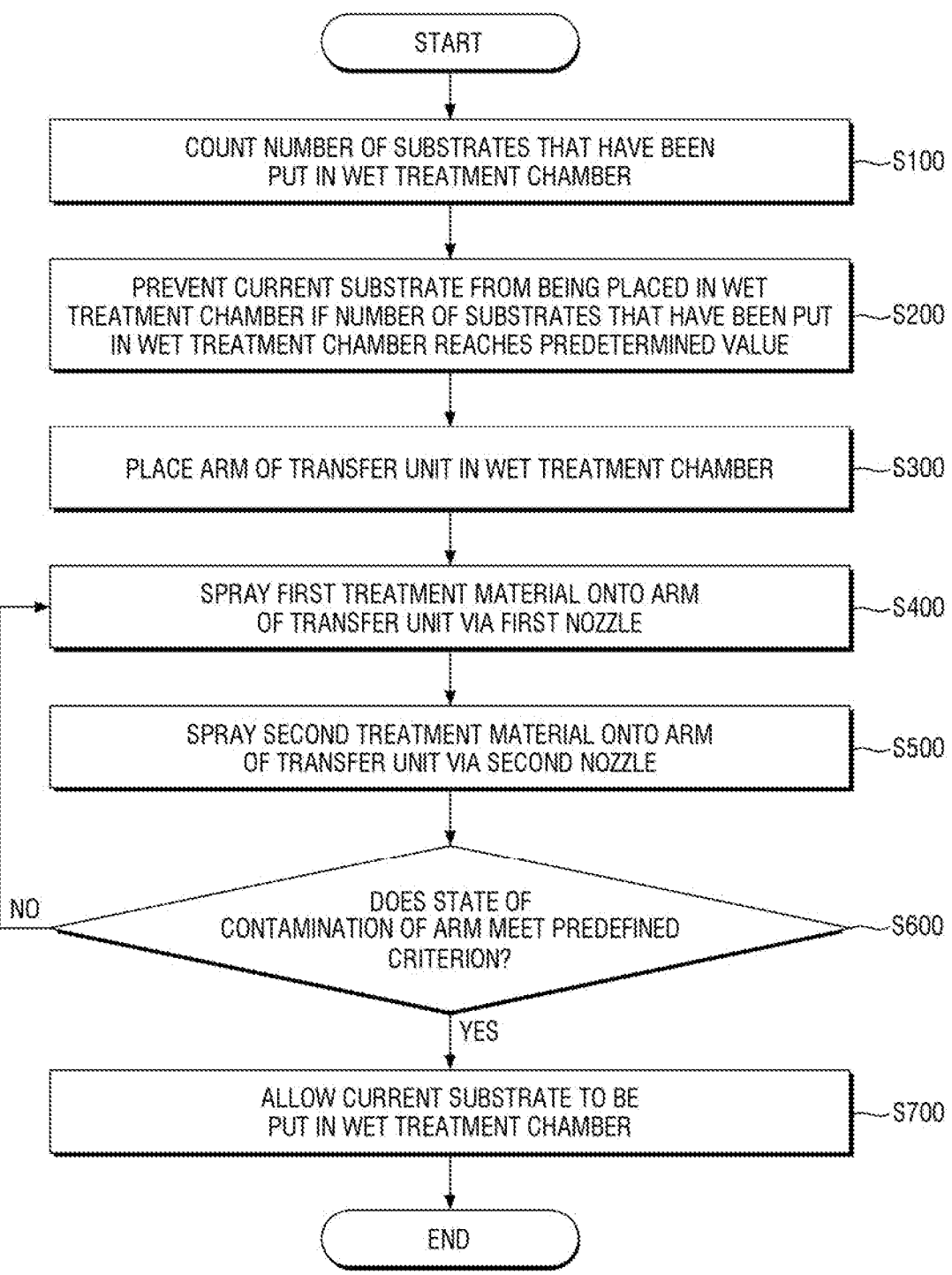
FIG. 10 is a flowchart illustrating a method of manufacturing a semiconductor device using the apparatus of FIG. 1, according to an embodiment.

Thereafter, referring to FIGS. 9 and 10, the control unit or controller 3400 may control a second nozzle 3221b to spray a second treatment material onto the arm A at operation S500 with the current substrate W prevented from being put or placed in the wet treatment chamber 3200.

In embodiments, because the support plate 3211 is disposed below the arm A of the transfer device 3120, the second treatment material may also be sprayed onto the support plate 3211 by the control unit or controller 3400.

For example, the second treatment material may include $N_2$, but embodiments are not limited thereto.

In embodiments, the wet treatment chamber 3200 may include a plurality of nozzles corresponding to a plurality of arms A. First and third nozzles may be provided to spray the first treatment material to left and right arms A, respectively, and second and fourth nozzles may be provided to spray the second treatment material to the left and right arms A. In this case, any contaminants can be further effectively removed from the left and right arms A.

The control unit or controller 3400 may control the range and speed of movement of the arm A. The control unit or controller 3400 may control the driving radius of the arm A on a support unit or support 3210. Also, the control unit or controller 3400 may control the speed at which the arm A is driven and whether to accelerate and decelerate the arm A. Accordingly, the moving speed, the acceleration, and the direction of the arm A on the support unit or support 3210 can be controlled.

In this case, the arm A may be provided to be movable in the first direction X, the second direction Y, and/or the third direction Z, but embodiments are not limited thereto. In embodiments, the arm A may be provided to be movable in directions at an inclination with respect to the first direction X, the second direction Y, or the third direction Z.

The control unit or controller 3400 may control the time and duration of discharging the first and second treatment materials from the first and second nozzles 3221a and 3221b. The control unit or controller 3400 may control the first and second nozzles 3221a and 3221b by controlling the opening and closing of first and second valves V1 and V2. The control unit or controller 3400 may control whether to discharge the first and second treatment materials and when and for how long to discharge the first and second treatment materials by controlling the opening and closing of first and second valves V1 and V2.

The apparatus 1 may further include a sensor 3300, as illustrated in FIG. 3. The sensor 3300 may sense and acquire an image regarding the state of the arm A being treated.

Referring to FIG. 10, the control unit or controller 3400 may compare data obtained through machine learning regarding the contamination of the arm A and the support plate 3211 with the image acquired by the sensor 3300 regarding the state of the support plate 3211 being treated. Then, states of contamination of the arm A and the support plate 3211 may be determined via the control unit or controller 3400 and the sensor 3300 at operation S600.

Specifically, if the state of contamination of the arm A and/or the support plate 3211 meets a predefined criterion (YES at operation S600), the control unit or controller 3400 may control the current substrate W to be put or placed in the wet treatment chamber 3200 at operation S700. Thereafter, the control unit or controller 3400 may control the transfer device 3120 to transfer the current substrate W from the wet treatment chamber 3200 to a supercritical fluid treatment chamber 3500.

In embodiments, if the state of contamination of the arm A and/or the support plate 3211 does not meet the predefined criterion (NO at operation S600), the control unit or controller 3400 may continue to control the current substrate W not to be put or placed in the wet treatment chamber 3200. In this case, the control unit or controller or controller 3400 may control the first and second nozzles 3221a and 3221b to spray the first and second treatment materials again onto the arm A and/or the support plate 3211.

Thereafter, if the state of contamination of the arm A and/or the support plate 3211 meets the predefined criterion, the control unit or controller 3400 may control the transfer device 3120 to transfer the current substrate W from the wet treatment chamber 3200 to the supercritical fluid treatment chamber 3500.

In this manner, a pattern leaning phenomenon can be minimized, and a semiconductor device including a substrate W with reduced contamination can be fabricated. For example, a semiconductor device obtained by the method of FIG. 10 may be a nonvolatile memory chip such as a dynamic random access memory (DRAM) chip or a static random-access memory (SRAM) chip, a nonvolatile memory chip such as a phase-change random-access memory (PRAM) chip, a magneto-resistive random-access memory (MRAM) chip, a ferroelectric random-access memory (FeRAM) chip, a resistive random-access memory (RRAM) chip, or a NAND flash memory, or a high-bandwidth memory (HBM) memory chip in which multiple DRAM chips are stacked.

Also, the semiconductor device obtained by the method of FIG. 10 may be a fin field-effect transistor (FinFET) including a fin-shaped channel region, a transistor including nanowires or nanosheets, a multibridge channel field-effect transistor (MBCFET™), a tunneling field-effect transistor (FET), or a three-dimensional (3D) transistor, but embodiments are not limited thereto.

Embodiments of the present disclosure have been described above with reference to the accompanying drawings, but embodiments are not limited thereto and may be implemented in various different forms. It will be understood that the present disclosure can be implemented in other specific forms without changing the technical spirit or gist of the present disclosure. Therefore, it should be understood that the embodiments set forth herein are illustrative in all respects and not limiting.

What is claimed is:

1. An apparatus for manufacturing a semiconductor device, the apparatus comprising:
   a wet treatment chamber;
   a support provided in the wet treatment chamber and configured to support a substrate;
   a nozzle provided in the wet treatment chamber and configured to spray a treatment material onto the substrate;
   a supercritical fluid treatment chamber configured to supply a supercritical fluid onto the substrate to treat the substrate;
   a transfer device comprising an arm configured to transfer the substrate between the wet treatment chamber and the supercritical fluid treatment chamber; and
   a controller configured to control the wet treatment chamber to simultaneously spray the treatment material onto the arm and the support.

2. The apparatus of claim 1, wherein the controller is further configured to:
   count a number of substrates which have been placed in the wet treatment chamber, and
   control the transfer device to prevent a current substrate from being placed in the wet treatment chamber based on the counted number reaching a predetermined value.

3. The apparatus of claim 2, wherein the controller is further configured to control the arm to be placed in the wet treatment chamber while the current substrate is prevented from being placed in the wet treatment chamber.

4. The apparatus of claim 1, wherein the controller is further configured to control the nozzle to spray the treatment material onto the arm, in the wet treatment chamber.

5. The apparatus of claim 1, wherein the treatment material comprises isopropyl alcohol (IPA).

6. The apparatus of claim 1, wherein the treatment material comprises $N_2$.

7. The apparatus of claim 1, wherein the controller is further configured to control a range and a speed of a movement of the arm.

8. The apparatus of claim 1, wherein the controller is further configured to control a time and a duration at which the treatment material is sprayed from the nozzle.

9. The apparatus of claim 1, further comprising:
   a sensor configured to acquire an image regarding a state of the arm being treated,
   wherein the controller is further configured to determine a state of contamination of the arm by comparing the image with data obtained based on machine learning regarding the contamination of the arm.

10. The apparatus of claim 9, wherein based on the state of the contamination of the arm meeting a predefined criterion, the controller is further configured to control the transfer device to place the substrate in the wet treatment chamber.

11. An apparatus for manufacturing a semiconductor device, the apparatus comprising:
    a wet treatment chamber;
    a support provided in the wet treatment chamber and configured to support a substrate;
    a first nozzle provided in the wet treatment chamber and configured to spray a first rinsing material onto the substrate;
    a second nozzle provided in the wet treatment chamber and configured to spray a second rinsing material onto the substrate;
    a supercritical fluid treatment chamber configured to supply a supercritical fluid onto the substrate to treat the substrate;
    a transfer device comprising an arm configured to transfer the substrate between the wet treatment chamber and the supercritical fluid treatment chamber; and
    a controller configured to control the first nozzle to simultaneously spray the first rinsing material onto the arm and the support, and to control the second nozzle to simultaneously spray the second rinsing material onto the arm and the support.

12. The apparatus of claim 11, wherein the controller is further configured to count a number of substrates which have been placed in the wet treatment chamber, and control the transfer device to prevent a current substrate from being placed on the support based on the counted number reaching a predetermined value.

13. The apparatus of claim 12, wherein the controller is further configured to control the arm to be placed in the wet treatment chamber while the current substrate is prevented from being placed in the wet treatment chamber.

14. The apparatus of claim 13, wherein the controller is further configured to control the first nozzle to spray the first rinsing material onto the support and the arm while the current substrate is prevented from being placed in the wet treatment chamber.

15. The apparatus of claim 14, wherein the controller is further configured to control the second nozzle to spray the second rinsing material onto the support and the arm, after spraying the first rinsing material onto the support and the arm.

* * * * *